(12) United States Patent
Chen et al.

(10) Patent No.: US 6,522,063 B2
(45) Date of Patent: Feb. 18, 2003

(54) LIGHT EMITTING DIODE

(75) Inventors: Shi Ming Chen, Tainan Hsien (TW); Wen Liang Li, Tainan (TW); Henrg Chen, Tainan (TW); Hsin Chuan Wang, Taipei (TW)

(73) Assignee: Epitech Corporation, Tainan County (TW)

( * ) Notice: Subject to any disclaimer, the term of this patent is extended or adjusted under 35 U.S.C. 154(b) by 21 days.

(21) Appl. No.: 09/820,252

(22) Filed: Mar. 28, 2001

(65) Prior Publication Data

US 2002/0158572 A1 Oct. 31, 2002

(51) Int. Cl.[7] .................................................. H01J 1/62
(52) U.S. Cl. ...................................... 313/498; 313/506
(58) Field of Search ................................. 313/509, 506, 313/508, 501, 498, 499; 257/431, 40, 98, 89, 94

(56) References Cited

U.S. PATENT DOCUMENTS

| 4,391,683 A | * | 7/1983 | Buckley et al. | ............. | 205/655 |
| 5,054,030 A | * | 10/1991 | Sakaki | ........................ | 372/45 |
| 5,065,502 A | * | 11/1991 | Amante | ........................ | 29/593 |
| 5,523,589 A | * | 6/1996 | Edmond et al. | ............. | 257/103 |
| 5,607,876 A | * | 3/1997 | Biegelsen et al. | ............. | 438/45 |
| 5,711,694 A | * | 1/1998 | Levine et al. | .................. | 445/24 |
| 6,366,017 B1 | * | 4/2002 | Antoniadis et al. | ......... | 313/113 |
| 6,373,188 B1 | * | 4/2002 | Johnson et al. | ................ | 257/94 |

FOREIGN PATENT DOCUMENTS

| JP | 63151084 A | * | 6/1988 | ........... H01L/29/80 |
| JP | 02000214013 A | * | 8/2000 | |

\* cited by examiner

Primary Examiner—David Martin
Assistant Examiner—Thanh S. Phan
(74) Attorney, Agent, or Firm—J. C. Patents

(57) ABSTRACT

A light emitting diode. The light emitting diode has a substrate that has two surfaces. On one surface, a distributed Bragg reflector, an n-type confining layer, an active layer, a p-type confining layer, a current spreading layer, a meshed Ohmic contact layer, a transparent conductive oxide layer and a front side electrode are formed. The other surface has a rear side electrode formed thereon. Via the meshed structure, the absorbing area of the Ohmic contact layer is reduced to avoid the light emitting from the active layer being greatly absorbed by the Ohmic contact layer. In contrast, the light intensity of the light emitting diode is increased.

23 Claims, 6 Drawing Sheets

LIGHT EMITTING DIODE

BACKGROUND OF THE INVENTION

1. Field of the Invention

The invention relates in general to a light emitting diode. More particularly, the invention relates to a light emitting diode comprising a meshed Ohmic contact layer to result in high light intensity.

2. Description of the Related Art

As the technique of light emitting diodes becomes more and more advanced, large area displays with high reliability have been fabricated. As the light emitting diodes used in large displays require very high light intensity, clarity is greatly demanded. In addition, the content of the display has to be observed from a long distance. To have a high light intensity and low power consumption is always the goal for developing light emitting diodes.

One of the major materials for fabricating light emitting diodes are direct bandgap materials such as aluminum gallium indium phosphide (AlGaInP). To match with the lattice of gallium arsenide (GaAs), an appropriate adjustment of the proportions of aluminum and gallium can adjust the wavelength of the luminescence to between 550 nm and 680 nm, that is, between green light and red light. As the addition of aluminum increases the bandgap, an aluminum gallium indium phosphide with high aluminum content is used as a confining layer to sandwich the central carrier luminescence layer or active layer. The carrier injection is thus enhanced, and the high efficiency double heterostructure of a light emitting diode is formed. As the bandgap of the confining layer is larger than the energy of the generated photons, the light emitted from the active layer is not absorbed by the confining layer.

In FIG. 1, a typical aluminum gallium indium phosphide light emitting diode is shown. An n-type aluminum gallium indium phosphide confining layer 102, an aluminum gallium indium phosphide active layer 104, and a p-type aluminum gallium indium phosphide confining layer 106 are formed on a gallium arsenide substrate 100 using metal organic chemical vapor deposition (MOCVD). A front side electrode 108 and a rear side electrode 110 are then evaporated to complete the fabrication of the light emitting diode. To enhance the light intensity, a distributed Bragg reflector 112 is added under the n-type aluminum gallium indium phosphide confining layer 102. Thus constructed, the photons emitting to the n-type gallium arsenide substrate 100 are reflected to the front side to be output. As the p-type aluminum gallium indium phosphide confining layer 106 has the problem of low mobility and difficulty of doping, the resistivity is relatively high (about 0.5 Ohm-cm). Consequently, the lateral current cannot be effectively distributed around the whole chip. As the majority of carriers are injected right under the front side electrode 108, other positions of the active layer 104 cannot obtain enough carriers for radiative recombination which causes the luminescence. Furthermore, the current crowding effect also causes the majority of light to be blocked by the non-transparent front side electrode and reflected back to the bulk, or absorbed by the substrate 100 to cause a degradation of light efficiency.

In FIG. 2, to resolve the drawback of the light emitting diode as shown in FIG. 1, a current spreading layer 114 is added between the p-type aluminum gallium indium phosphide confining layer 106 and the front side electrode 108. In addition to the excellent transparency of the light emitting from the active layer 104, the current spreading layer 114 is easier doped than the p-type aluminum gallium indium phosphide confining layer 106 and has a higher mobility. As a result, the current can be distributed more evenly on the chip. Currently, aluminum gallium arsenide is used as the material for forming the current spreading layer 114. The thickness of the current spreading layer 114 is normally tens of microns in order to achieve the current spreading capacity. However, the metal organic chemical vapor deposition used to form such a current spreading layer 114 has a very slow growth rate. The fabrication cost is thus very high, and the fabrication time is long.

FIG. 3 illustrates structure to resolve the problems mentioned above and layer 114 is removed. A transparent conductive oxide layer 116 is formed as the current spreading layer of the light emitting diode. The transparent conductive oxide layer 116 not only has a great transparency, but also has an extremely low resistivity (about $3 \times 10^{-}$ Ohm-cm). The current can thus be evenly distributed on the chip to enhance the light efficiency of the light emitting diode. The proper material of such transparent conductive oxide comprises indium oxide, tin oxide and indium tin oxide. To have a good Ohmic contact between the transparent conductive oxide layer and the semiconductor, and to increase adhesion, a heavily doped p-type Ohmic contact layer 118 is formed prior to formation of the transparent conductive oxide layer 116. The thickness of the Ohmic contact layer 118 is about 500 angstroms with a doping concentration larger than $10^{-18}$ $cm^{-3}$. The material for forming the Ohmic contact layer 118 includes gallium arsenide or gallium arsenic phosphide (GaAsP). Before forming the conductive oxide layer as the current spreading layer 116, it is necessary to grow the p-type Ohmic contact layer 118. However, as the energy bandgap of the Ohmic contact layer 118 is smaller than the energy bandgap of the active layer 104, the luminescence of the light emitting diode is absorbed by the Ohmic contact layer 118 to seriously affect the light intensity.

FIG. 4 shows the distribution of light absorption coefficients at different wavelengths for different materials. The light absorption coefficiency α of different compounds such as gallium indium arsenic phosphide (GaInAsP), gallium arsenide (GaAs), indium phosphide (InP), germanium (Ge), gallium phosphide (GaP) and silicon (Si) at 300 K can be seen.

SUMMARY OF THE INVENTION

The invention provides a light emitting diode. By a meshed structure, the area of light absorption of an Ohmic contact layer is greatly reduced. As a result, the light intensity of the light emitting diode is greatly enhanced.

The light emitting diode provided by the invention comprises a substrate with a first side and a second side. A distributed Bragg reflector, an n-type confining layer, an active layer, a p-type confining layer, a current spreading layer, a meshed Ohmic contact layer, a transparent conductive oxide layer and a front side electrode are formed on the first side of the substrate. A rear side electrode is formed on the second side of the substrate. As the Ohmic contact has an energy bandgap smaller than the luminescence of the active layer, the luminescence is thus absorbed thereby. However, by forming the Ohmic contact layer with a meshed structure, the area of absorbing the luminescence is effectively reduced. The light intensity of the lumicescence of the light emitting diode is thus enhanced.

Both the foregoing general description and the following detailed description are exemplary and explanatory only and are not restrictive of the invention, as claimed.

DESCRIPTION OF THE PREFERRED EMBODIMENTS

As the current crowding effect occurs to the conventional light emitting diode structure, a large proportion of the luminescence is blocked by the front side electrode and reflected back to the bulk of the semiconductor or absorbed by the substrate. The luminescence efficiency is seriously affected. Therefore, a current spreading layer is added to improve the current crowding effect. However, to effectively improve the current crowding effect, the thickness of the current spreading layer has to be over tens of microns. The growth rate for this particular current spreading layer is very slow using metal organic chemical vapor deposition, the fabrication cost and time are thus very much higher. For another conventional structure, a transparent conductive oxide layer is formed as the current spreading layer, and a p-type Ohmic contact layer is added prior to formation of the transparent conductive oxide layer to increase the adhesion. As the Ohmic contact layer has an energy bandgap smaller than the energy bandgap of the active layer, the light emitted therefrom is thus absorbed by the Ohmic contact layer to greatly reduce the light intensity of the light emitting diode. This invention thus forms a meshed Ohmic contact layer to replace the conventional Ohmic contact layer. Due to the meshed structure, the area of absorbing the luminescence is greatly reduced. In contrast, the luminescence efficiency of the light emitting diode is effectively enhanced.

Figure 1:
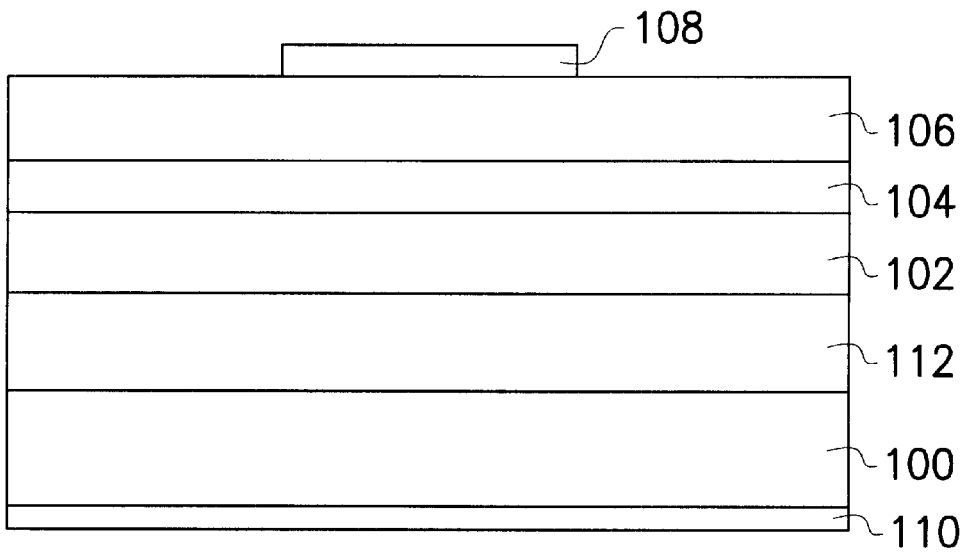
FIGS. 1 to 3 show three different conventional light emitting diodes.
Figure 2:
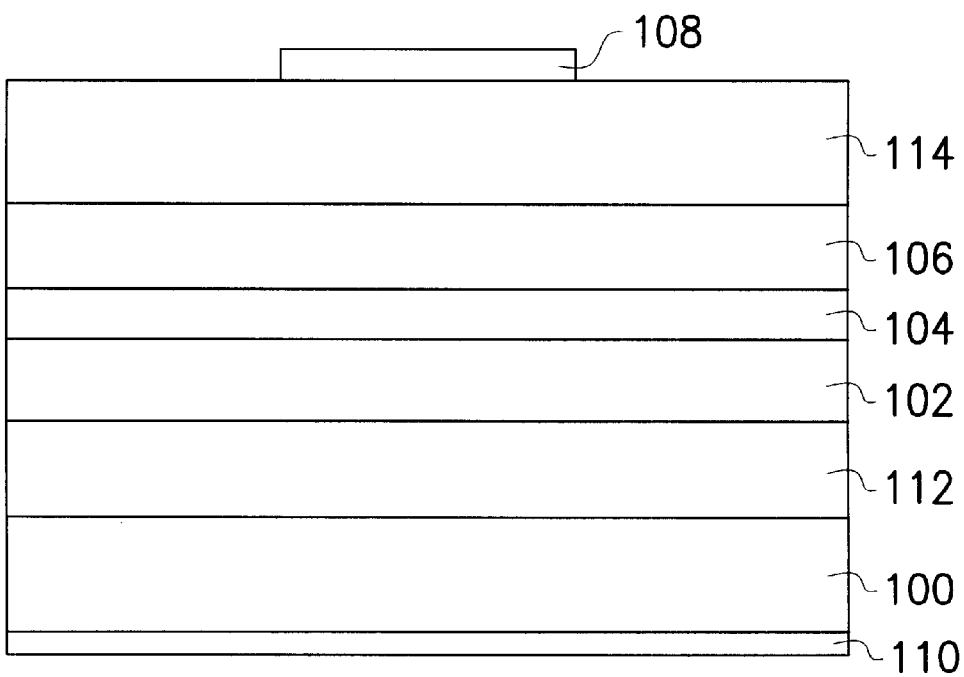
Figure 3:
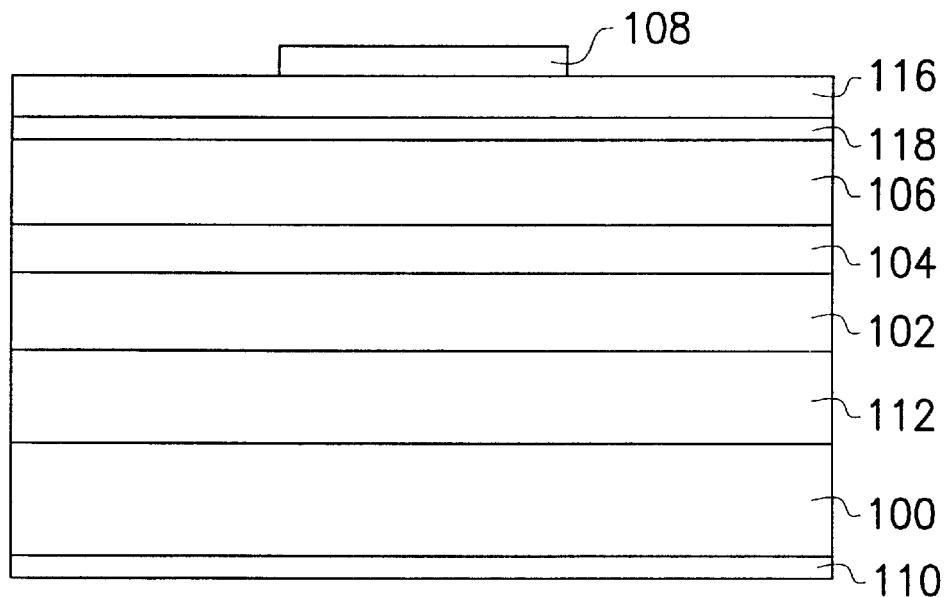
Figure 4:
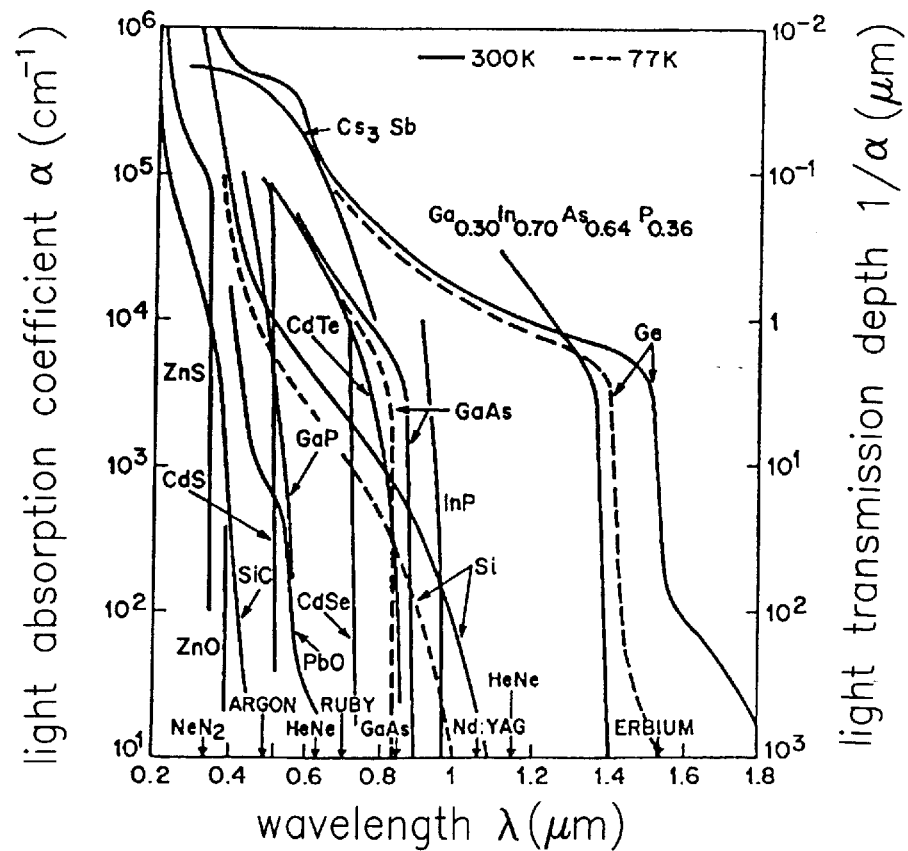
FIG. 4 shows the light absorption coefficients of different materials at different wavelengths.
Figure 5:
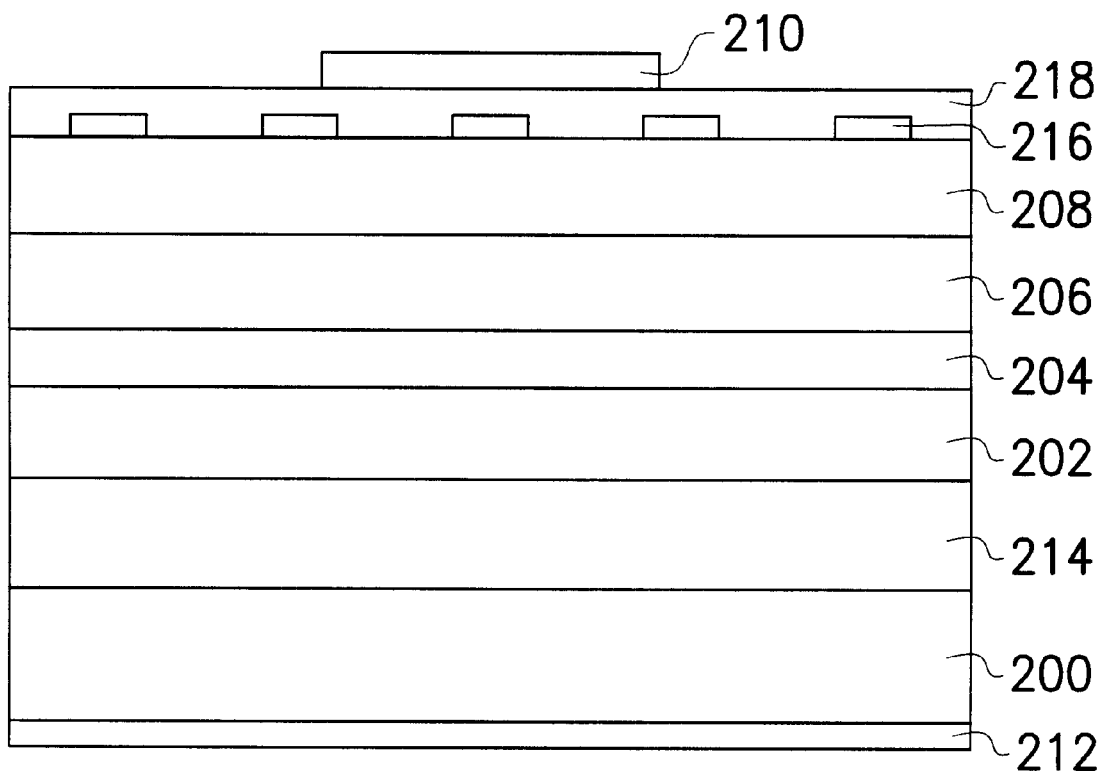
FIG. 5 shows an embodiment of a light emitting diode according to the invention.

In FIG. 5, an embodiment of a light emitting diode according to the invention is illustrated. A substrate 200, for example, an n-type gallium arsenide substrate, is provided. The substrate 200 comprises a first side and a second side. A distributed Bragg reflector 214 is formed on the first side of the substrate, such that the distributed Bragg reflector 214 is located on the substrate to reflect the photons incident towards the first side of the substrate 200. A confining layer 202, an active layer 204, and a confining layer 206 are sequentially formed on the distributed Bragg reflector 214. The confining layer 202 is made of an n-type aluminum gallium indium phosphide. The material of the active layer includes undoped aluminum gallium indium phosphide, for example, and the confining layer 206 includes a layer of p-type aluminum gallium indium phosphide. The confining layers 202 and 206 sandwich the active layer 204 to increase the efficiency of carrier injection. A current spreading layer 208 is then formed on the confining layer 206.

Figure 6:
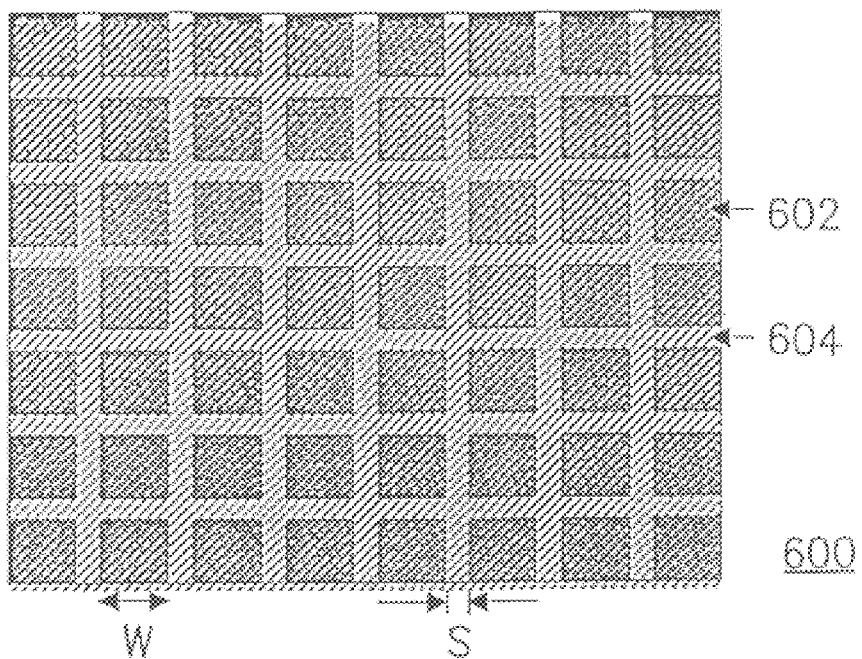
FIG. 6 shows a mask pattern for forming a meshed Ohmic contact layer.

In FIGS. 5 and 6, a meshed Ohmic contact layer 216 is formed on the current spreading layer 208. The method for forming such meshed Ohmic contact layer 216 includes the following steps. An Ohmic contact layer (not shown) is formed on the current spreading layer 208. The material of the Ohmic contact layer includes gallium arsenide, gallium phosphide or gallium arsenic phosphide. A photoresist layer is spin coated on the Ohmic contact layer. An exposure step is performed using the photomask 600 as shown in FIG. 6. A developer is used to resolve the photoresist layer, and the photoresist layer is patterned as a mask. The Ohmic contact layer that has not been covered with the patterned photoresist layer is exposed and etched until the current spreading layer 208 is exposed. The photoresist layer is removed, and a meshed Ohmic contact layer 216 is formed. In FIG. 6, the photomask pattern for forming the meshed Ohmic contact layer includes the solid portion 602 that indicates the area to be etched, and the hatched portion 604 indicates the area to be remained as the meshed Ohmic contact layer 216.

In FIG. 6, after the meshed Ohmic contact layer 216 is formed, a transparent conductive oxide layer 218 is formed to cover the current spreading layer 208 and the meshed Ohmic contact layer 216. The material of the transparent conductive oxide layer 218 includes indium oxide, tin oxide or indium tin oxide that has good transparency, for example. A front side electrode 210 is formed on a portion of the transparent conductive oxide layer 218. A rear side electrode 212 is formed on the second side of the substrate 200, so that the rear side electrode 212 is located underneath the substrate 200. The material of the front and rear side electrode includes those metals with good conductivity. As the energy bandgap of the meshed Ohmic contact layer 216 is smaller than that of the active layer 204, the luminescence emitted from the active 204 is absorbed by the meshed Ohmic contact layer 216. However, due to formation of the meshed structure, the area to absorb the luminescence is greatly reduced. The luminescence of the light emitting diode can thus be enhanced.

To ensure that the current is evenly distributed on the chip after reducing the area of the Ohmic contact layer, a two-dimensional current distribution has been derived from a one-dimensional current distribution formula as:

$$J(x) = \frac{J_0}{\left(x/l_s + \sqrt{2}\right)^2}$$

$$l_s = \left(\frac{gtnkT}{J_0 e}\right)^{1/2}$$

$J_o$ is the current density under the metal. $J(x)$ is the current density at a position distant from the metal with x. $l_s$ is the lateral spreading length. g is the conductivity of the current spreading layer. t is the thickness of the current spreading layer. n is the ideal factor of the light emitting diode. k is the Boltzman constant, $1.3\ 8 \times 10^{-23}$ J/K. T is the absolute temperature (°K). e is the elementary charge, $1.60218 \times 10^{-19}$ C.

Figure 7:
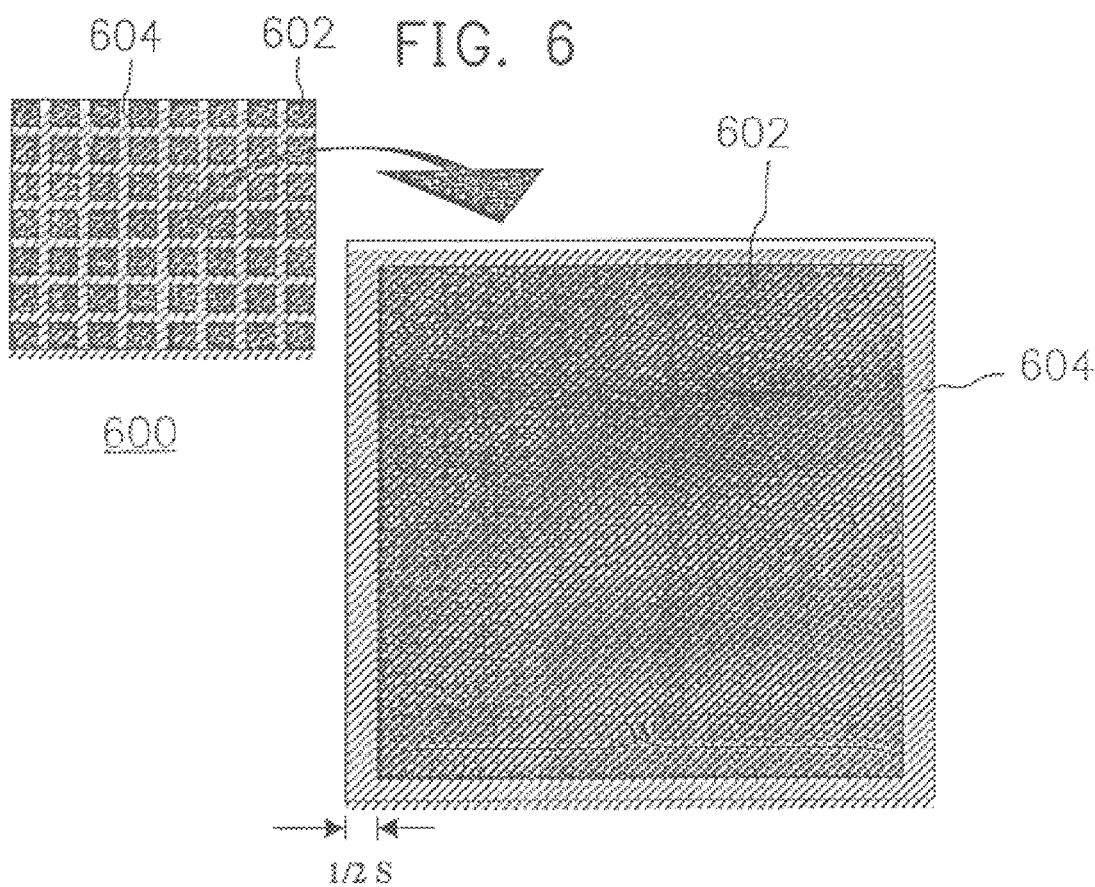
FIG. 7 shows an enlarged view of the mask as shown in FIG. 6.

In FIG. 7, an enlarged view of the photomask as shown in FIG. 6 is illustrated. In FIG. 6, w is the length of a side of the square area to be etched. s is the line-width of the meshed layer, that is, the line-width of the meshed Ohmic contact layer. t is the thickness of the current spreading layer. $J(x)$ is a function of w, s and t. For any variation of w, s and t, the current density at any point of the active layer is affected. In the following example, a gallium arsenide current spreading layer is used as an example to simulate the current spreading status and the overall light intensity of the light emitting diode provided by the invention. A comparison between the invention and the conventional light emitting diode without the meshed structure of the Ohmic contact layer is given.

Figure 8A:
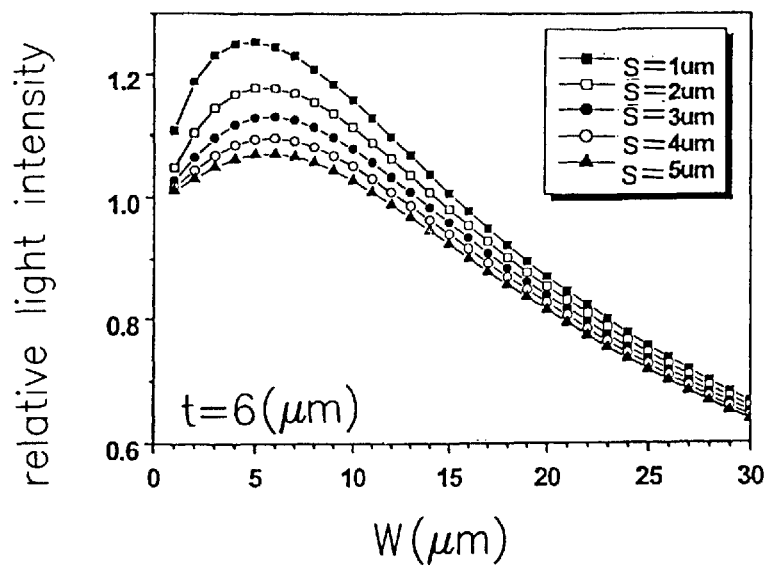
FIG. 8A shows the relationship between the relative light intensity and the dimension of the aperture w for different line-widths of gallium arsenide when the current spreading layer has a thickness of 6 microns.

In FIG. 8A, the thickness of the current spreading layer is fixed at 6 microns. A relationship between the relative light intensity and the aperture created by etched length w for different line-widths s of the gallium arsenide can be seen in FIG. 8A. The relative light intensity is the magnitude after being normalized with the light intensity of the conventional structure without the meshed structure. When w=0, the light intensity is equivalent to that of the conventional light emitting diode without the meshed structure of the Ohmic contact layer. By extrapolation, one can obtain the corresponding value on the Y-axis (=1). Using the same line-width s with a meshed layer, this figure can be interpreted into two parts:

(1) When the etched length w is smaller than 5 microns, the area of light absorption is smaller as w increases, and the light intensity is enhanced.

(2) When w is increased to a certain value (>5–6 microns), the current distribution is uneven, or even the distribution area is reduced, the area of luminescence is decreased. The total area of light absorption of the Ohmic contact layer is decreased as w increases. However, the total light intensity is also reduced. If the length w to be etched is fixed, and the line-width of the meshed layer s is increased, the area of light absorption is increased, and the overall light intensity is decreased.

FIG. 8A shows that the light emitting diode with s=1 micron and w=5 micron not only has the characteristics of even current distribution, but also has an Ohmic contact layer with an effectively reduced area of light absorption. The light intensity is, consequently, much increased.

Figure 8B:
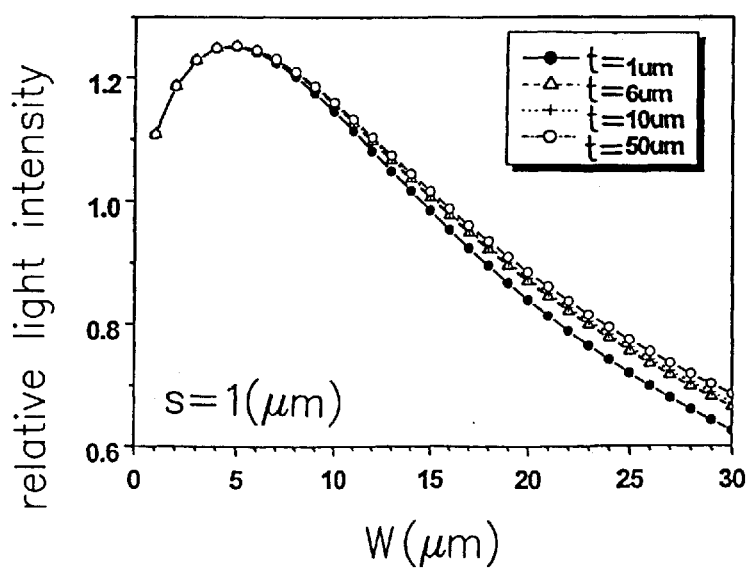
FIG. 8B shows the relationship between the relative light intensity and the dimension of the aperture w for different thickness of the current spreading layer when the line-width of gallium arsenide is fixed at 1 micron.

FIG. 8B shows the relationship between the relative light intensity and the aperture w for current spreading layers having different thickness. From FIG. 8B, it is shown that if the aperture is not large, the effect from the thickness of the current spreading layers upon the light intensity is not significant. However, once the aperture is large (w>13–14 microns), the current spreading effect is significant, and the luminescence area is reduced. As a result, the light intensity is reduced, and the luminescence efficiency is greatly reduced.

From the above discussion, the current spreading layer of the invention does not require a thickness of tens of microns. Moreover, even without using such a current spreading layer, the object of having even current distribution can still be achieved. By using the meshed structure of the Ohmic contact layer, the drawbacks of having narrow bandgap can be improved. That is, the meshed structure of the Ohmic contact layer greatly enhances the luminescence efficiency of the light emitting diode.

Figure 9:
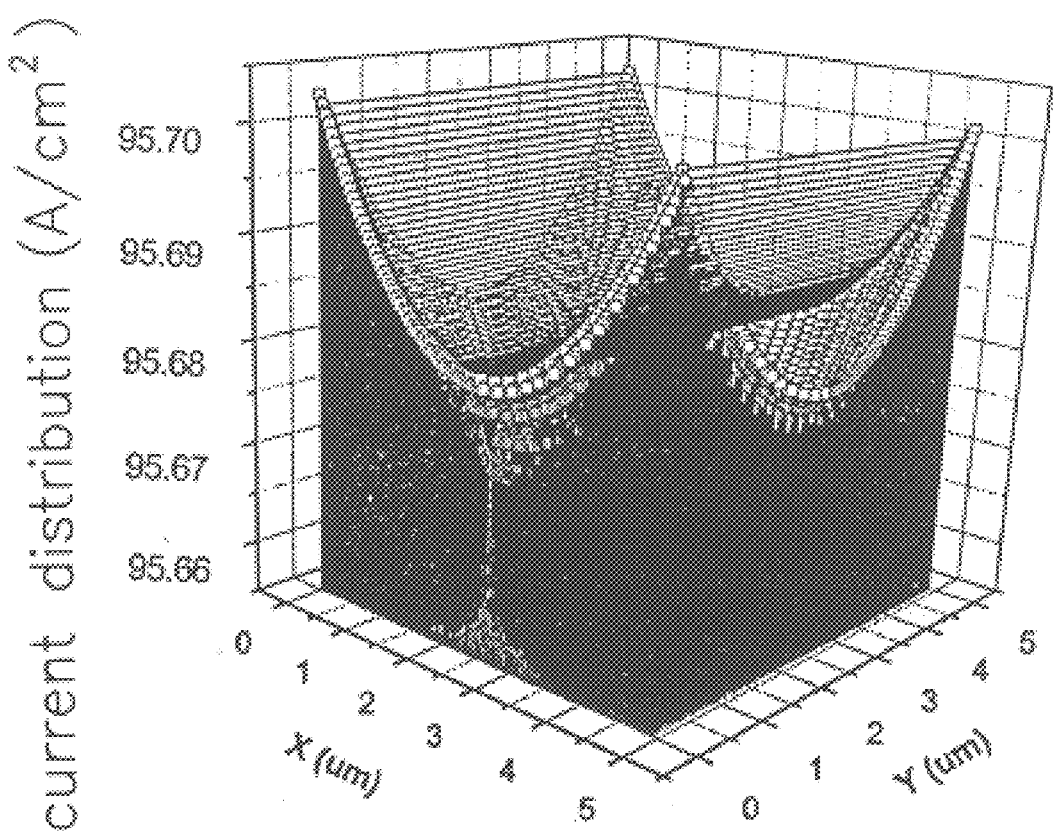
FIG. 9 shows a simulation of current distribution within each unit cell of the light emitting diode provided by the invention.

In the above example, a current and a light intensity of a light emitting diode injected with 50 mA are compared. A larger light intensity is expected to be obtained compared to the conventional light emitting diode. The conventional current density is about 50 mk((9 mil)$^2$=95.679 A/cm$^2$. For each unit cell of the light emitting diode as shown in FIG. 7, the result of the simulation is shown as FIG. 9. When t=6 microns, s=1 micron and w=5 microns, the maximum value is 95.7 A/cm$^2$ and the minimum value is 95.659 A/cm$^2$. It is shown that the current density is very uniform. The resultant light intensity is about 1.25 times that of the conventional light emitting diode.

As a summary, the invention comprises at least the following advantages:

1. The current spreading layer does not need a thickness as thick as tens of microns. Furthermore, the current spreading layer can be removed to achieve the same effect of uniform current distribution. Therefore, the fabrication cost is reduced, and the time for making such a device is shortened.
2. In the invention, the meshed structure of the Ohmic contact layer of the light emitting diode improves the drawback of having a narrow energy bandgap. The light intensity of the device is greatly enhanced.
3. The light emitting diode provided by the invention has a uniform current distribution due to formation of the meshed structure of the Ohmic contact layer. The overall light intensity is about 1.25 times of the conventional light emitting diode.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A light emitting diode, comprising:
   a substrate having a first side and a second side;
   an electrode, on the second side of the substrate;
   a distributed Bragg reflector, on the first side of the substrate;
   a first conductive type confining layer, on the distributed Bragg reflector;
   an active layer, on the first conductive type confining layer;
   a second conductive type confining layer, on the active layer;
   a current spreading layer, on the second conductive type confining layer;
   a meshed Ohmic contact layer, on the current spreading layer;
   a transparent conductive oxide layer, on the meshed Ohmic contact layer; and
   a front side electrode, on a portion of the transparent conductive oxide layer.

2. The light emitting diode according to claim 1, wherein the first conductive type confining layer includes an n-type aluminum indium gallium phosphide layer.

3. The light emitting diode according to claim 1, wherein the second conductive type confining layer includes a p-type aluminum indium gallium phosphide layer.

4. The light emitting diode according to claim 1, wherein the material of the active layer is selected from an undoped aluminum indium gallium phosphide with a quantum well structure.

5. The light emitting diode according to claim 1, wherein the material of the current spreading layer includes a group consisting of aluminum gallium arsenide and gallium phosphide.

6. The light emitting diode according to claim 1, wherein the material of the meshed Ohmic contact layer includes a group consisting of gallium arsenide, gallium phosphide and gallium phosphide arsenide.

7. The light emitting diode according to claim 1, wherein the material of the transparent conductive oxide layer is selected from a group consisting of indium oxide, tin oxide and indium tin oxide.

8. A light emitting diode, comprising:
a substrate having a first side and a second side;
an electrode, on the second side of the substrate;
a distributed Bragg reflector, on the first side of the substrate;
a first conductive type confining layer, on the distributed Bragg reflector;
an active layer, on the first conductive type confining layer;
a second conductive type confining layer, on the active layer;
a meshed Ohmic contact layer, on the second conductive type confining layer;
a transparent conductive oxide layer, on the meshed Ohmic contact layer; and
a front side electrode, on the transparent conductive oxide layer.

9. The light emitting diode according to claim 8, wherein the first conductive type confining layer includes an n-type aluminum indium gallium phosphide layer.

10. The light emitting diode according to claim 8, wherein the second conductive type confining layer includes a p-type aluminum indium gallium phosphide layer.

11. The light emitting diode according to claim 8, wherein the material of the active layer is selected from an undoped aluminum indium gallium phosphide with a quantum well structure.

12. The light emitting diode according to claim 8, wherein the material of the meshed Ohmic contact layer includes a group consisting of gallium arsenide, gallium phosphide and gallium phosphide arsenide.

13. The light emitting diode according to claim 8, wherein the material of the transparent conductive oxide layer is selected from a group consisting of indium oxide, tin oxide and indium tin oxide.

14. A light emitting diode, comprising:
a substrate having a first side and a second side;
an electrode, on the second side of the substrate;
a distributed Bragg reflector, on the first side of the substrate;
a first conductive type confining layer, on the distributed Bragg reflector;
an active layer, on the first conductive type confining layer;
a second conductive type confining layer, on the active layer;
a current spreading layer, on the second conductive confining layer;
a meshed Ohmic contact layer, on the current spreading layer, wherein the meshed Ohmic contact layer has a first thickness and a plurality of gridlines of a first width, the gridlines spaced with-from each other by a second width;
a transparent conductive oxide layer, on the meshed Ohmic contact layer; and
a front side electrode, on the transparent conductive oxide layer.

15. The light emitting diode according to claim 14, wherein the first conductive type confining layer includes an n-type aluminum indium gallium phosphide layer.

16. The light emitting diode according to claim 14, wherein the second conductive type confining layer includes a p-type aluminum indium gallium phosphide layer.

17. The light emitting diode according to claim 14, wherein the active layer is made of a material selected from a group consisting of an undoped aluminum indium gallium phosphide and a quantum well structure thereof.

18. The light emitting diode according to claim 14, wherein the material of the current spreading layer is selected from a group consisting of aluminum gallium arsenide and gallium phosphide.

19. The light emitting diode according to claim 14, wherein the material of the meshed Ohmic contact layer is selected from a group consisting of gallium arsenide, gallium phosphide and gallium arsenic phosphide.

20. The light emitting diode according to claim 14, wherein the first thickness is about 6 microns.

21. The light emitting diode according to claim 14, wherein the first width is about 5 microns.

22. The light emitting diode according to claim 14, wherein the second width is about 1 micron.

23. The light emitting diode according to claim 14, wherein the material of the transparent conductive oxide layer is selected from a group consisting of indium oxide, tin oxide and indium tin oxide.

* * * * *